(12) United States Patent
Hunt et al.

(10) Patent No.: US 6,214,473 B1
(45) Date of Patent: Apr. 10, 2001

(54) CORROSION-RESISTANT MULTILAYER COATINGS

(76) Inventors: Andrew Tye Hunt, 495 Mountain Way, Atlanta, GA (US) 30342; Tzyy Jiuan Hwang, 510 Oak Bridge Trail, Alpharetta, GA (US) 30022; Michelle R. Hendrick, 109 Rockwell Church Rd. NE., Winder, GA (US) 30680; Hong Shao, 1185 Collier Rd., Apt. 3H, Atlanta, GA (US) 30318; Joseph R. Thomas, 795 Hammond Dr., Apt. 509, Atlanta, GA (US) 30328

( * ) Notice: Subject to any disclaimer, the term of this patent is extended or adjusted under 35 U.S.C. 154(b) by 0 days.

(21) Appl. No.: 09/078,123

(22) Filed: May 13, 1998

(51) Int. Cl.$^7$ ...................................................... B32B 9/00

(52) U.S. Cl. ........................ 428/469; 428/472; 428/701; 428/702

(58) Field of Search .................................. 428/469, 472, 428/701, 702; 359/359, 588

(56) References Cited

U.S. PATENT DOCUMENTS

| | | |
|---|---|---|
| 3,849,057 | 11/1974 | Peck et al. . |
| 3,883,336 | 5/1975 | Randall . |
| 4,341,841 * | 7/1982 | Ohno et al. ......................... 428/414 |
| 4,379,196 * | 4/1983 | Halper . |
| 4,643,769 * | 2/1987 | Othen . |
| 4,647,316 * | 3/1987 | Prescott . |
| 4,822,466 | 4/1989 | Rabalais et al. . |
| 4,849,297 * | 7/1989 | Mansell et al. . |
| 4,931,425 | 6/1990 | Kimura et al. . |
| 4,938,940 | 7/1990 | Hirose et al. . |
| 4,938,993 * | 7/1990 | Bennett . |
| 4,957,591 | 9/1990 | Sato et al. . |
| 4,994,420 | 2/1991 | Baney et al. . |
| 5,002,928 | 3/1991 | Fukui et al. . |
| 5,017,550 | 5/1991 | Shioya et al. . |
| 5,021,399 | 6/1991 | Hsu et al. . |
| 5,026,684 | 6/1991 | Baney et al. . |
| 5,034,372 | 7/1991 | Matsuno et al. . |
| 5,041,241 * | 8/1991 | Fletcher . |
| 5,108,983 | 4/1992 | Lackey et al. . |
| 5,112,698 * | 5/1992 | Horvei et al. . |
| 5,152,819 | 10/1992 | Blackwell et al. . |
| 5,154,744 * | 10/1992 | Blackwell et al. . |
| 5,174,983 | 12/1992 | Snail . |
| 5,178,905 * | 1/1993 | Kanai et al. . |
| 5,190,807 * | 3/1993 | Kimock et al. ...................... 428/216 |
| 5,215,788 | 6/1993 | Murayam et al. . |
| 5,242,714 * | 9/1993 | Steele et al. . |
| 5,275,798 * | 1/1994 | Aida . |
| 5,614,035 | 3/1997 | Nadkarni . |
| 5,652,021 | 7/1997 | Hunt et al. . |
| 5,698,022 | 12/1997 | Classman et al. . |

FOREIGN PATENT DOCUMENTS

| | | |
|---|---|---|
| 0 252 755 | 1/1988 | (EP) . |
| 2 015 991 | 9/1979 | (GB) . |
| 60-108338 | 6/1985 | (JP) . |
| 62-288842 * | 12/1987 | (JP) . |
| 01305813 | 11/1989 | (JP) . |
| 94/21841 | 9/1994 | (WO) . |

OTHER PUBLICATIONS

A. T. Hunt et al. 1993, Combustion Chemical Vapor Deposition: A Novel Thin Film Deposition Technique, *Applied Physics Lettrs*, 63: pp. 266–268, (no month).

Bebbingon et al., "Rare earth deoped silica waveguides on Si fabricated by flame hydrolysis deposition and aerosol doping", *Applied Physics Letters,* 62, No. 4, pp. 337–339, Jan. 25, 1993.

Withers, J.C. et al., "Aluminum Coatings by a Pyrolytic Spray Chemical Vapor Disposition Process," *2d Int'l Conf. on CVD* (1970) (no month).

Blandenet, G. et al., "Indium Oxide Deposition on Glass by Aerosol Pyrolysis," *5th Int'l Conf on CVD* (1975).

Hirose, Y. et al., "The Synthesis of High Quality Diamond in Combustion Flame," *89–12 Proceedings of the Electrochemical Society* (1989) (no month).

Merkle, B.D. et al., "Superconducting $YBa_2Cu_3O_x$ Particulate Produced by Total Consumption Burner Processing," A124 *Mat. Sci. Eng.* 31–38 (1990) (no month).

Abe, T. et al., "Microcrystalline Diamond Deposition Using a Combustion Flame," 59(8) *Appl. Phys. Lett.* 911–913 (1991) (no month).

Han, O.Y. et al., "High Rate Deposition of Diamond Using Liquid Organic Precursors,", 91–8 *Proc. The Electrochem. Soc.* 115–122 (1991) no months.

Hirose, Y., "Combustion Flame Diamond Coating Method," *Applications of Diamond Films and Related Materials* (1991) (no month).

Hori, S. et al., "Characterization and Processing of CVD Powders for Fabrication of Composite and Compound Ceramics",*MRS Symposium Proceedings,* vol. 155, pp. 3–12, 1989 (no month).*

(List continued on next page.)

*Primary Examiner*—Timothy M. Speer
*Assistant Examiner*—Bryant Young
(74) *Attorney, Agent, or Firm*—Wayne E. Nacker; Alfred H. Muratori; Peter G. Pappas

(57) ABSTRACT

A corrosion-resistant coating for a substrate is described. The corrosion-resistant coating comprises a first distinct layer of a first composition disposed over the substrate, wherein the first distinct layer has a thickness that is not greater than about 10 microns, and a second distinct layer of a second composition disposed over the first distinct layer, wherein the second distinct layer has a thickness that is not greater than about 10 microns and either the first distinct layer or the second distinct layer is corrosion-resistant. Preferably, the thickness of each distinct layer is less than about 1 or 2 microns, more preferably, less than about 0.4 microns. The coating may comprise additional layers. Corrosion-resistant articles, methods of protecting an articles, and methods of depositing corrosion-resistant coatings are also described.

23 Claims, No Drawings

OTHER PUBLICATIONS

Smith et al., *Where Do We Go From Here?*, vol. 73, No. 12, Dec. 1994.*

McHale et al., "Preparation of High–Tc Oxide Films via Flaming Solvent Spray", *Journal of Superconductivity,* vol. 5, No. 6, 1992 (no month).*

Bebbington et al., "Rare earth doped silica waveguides on Si fabricated by flame hydrolysis deposition and aerosol doping", *Applied Physics Letters,* 62, No. 4, pp.337–339, Jan. 25, 1993.*

Murakawa et al., "An Experiment in Large Area Diamond Coating Using a Combustion Flame Torch in Its Traversing Mode," *Surface and Coating Technology,* vol. 43/44, pp. 22–29, (1990).

Hirose, "Flame Synthesis of Diamond," *Workshop on diamond thin films,* p. 776, (no month/date).

"Ceramic coatings," *Tech Bites: Automotive Engineering,* p. 74 (1993), (no month).

*Kirk–Othmer Concise Encyclopedia of Chemical Technology,* John Wiley & Sons, Inc., New York, pp. 277, 279 (1985), (no month).

Sundgren et al., "Growth, Structural Characterization and Properties of Hard and Wear–protective Layered Materials," *Thin Solid Films,* vol. 193/194, pp. 818–831 (1990), (no month).

Holleck et al., "Advanced Layer Material Constitution," *Thin Solid Films,* vol. 153, pp. 11–17 (1987), (no month).

Bull et al., "Multilayer Coatings for Improved Performance," *Surface and Coating Technology,* vol. 78, pp. 173–184 (1996), (no month).

Wunder et al., "Mulilayer Coatings on CFC Composites for High–temperature Applications," *Surface and Coatings Technology,* vol. 100–101, pp. 329–332 (1998), (no month).

Tsou et al., "Design of Multilayer Plasma–assisted CVD Coatings for the Oxidation Protection of Composite Materials," *Surface and Coatings Technology,* vol. 79, pp. 139–150 (1996), (no month.

Wiklund et al., "Multilayer Coatings as Corrosion Protection of Zircaloy," *Surface and Coatings Technology,* vol. 86–87, pp. 530–534 (1996), (no month).

* cited by examiner

CORROSION-RESISTANT MULTILAYER COATINGS

TECHNICAL FIELD

This invention relates to corrosion-resistant coating compositions and a process for applying multilayer coatings. More particularly, this invention relates to thin, multiple layer coatings composed of layers of at least two differing compositions. Preferably, the multiple layers of the coating are applied by a combustion chemical vapor deposition process. The coatings can be applied to the surfaces of various articles in order to provide beneficial surface properties to the articles.

BACKGROUND OF THE INVENTION

The use of coatings to provide corrosion protection to an underlying article or substrate is common. Protective coatings can include organic coatings such as paints and epoxies; nonmetallic coatings such as cements, enamels and oxides; and metallic coatings such as chrome and gold plating. Application of these coatings can be accomplished by such differing processes as painting and spraying to plating and vapor deposition. The process of applying the coating is often dependent on or limited by the properties of the material being deposited and of the properties of the substrate.

Research on improving protective coatings has been extensive for many different materials and applications. The object of protective coatings is to provide corrosion resistance to the underlying substrate and enhance the corrosion resistance of the substrate to the various environments the substrate may encounter. Many coatings are limited to particular environments because of their inability to withstand certain temperature and/or corrosive conditions. The use of organic binders in many coatings limits the use of those coatings at elevated temperatures. A coating not requiring organic binders may withstand elevated temperatures.

Additionally, many articles requiring corrosion protection have specific weight limitations. Therefore, thinner and accordingly lighter coatings are desired. Thinner coatings are also desirable because they require less material, do not significantly change the substrate size, and offer the potential to reduce material costs. Protective coatings, regardless of their composition and the manner in which they are applied, must be adherent to the substrate they are to protect. In order to protect the underlying substrate, the protective coatings must act as a protective barrier against the corrosive agent or as a sacrificial layer. Sacrificial protective layers have the disadvantage that a sacrificial protective layer only provides temporary protection and must be replaced once it has been expended.

Inorganic coatings have also been used for corrosion protection. However, inorganic coatings are typically made of materials that have low coefficients of the thermal expansion relative to the higher coefficient of thermal expansion metal substrates they are intended to protect. While inorganic coatings may perform adequately at a particular temperature, the inorganic coatings on the metal substrates are not able to withstand large temperature changes. When the metal substrate and the coating are subject to large temperature increases and decreases, the underlying metal substrate expands and contracts, respectively, to a greater degree than the inorganic coating. The coefficient of expansion mismatch causes the brittle inorganic coating to crack and break away from the surface of the metal, a phenomenon known as spalling. Thus, the metal is no longer protected by the coating and may become exposed to the corrosive agents.

Metals have been used as protective coatings. However, most metals are subject to corrosion, especially at elevated temperatures and in aqueous, salt and acidic environments. Additionally, metal coatings are expensive, heavy and can be removed by abrasion.

Accordingly, there is a need for an improved corrosion-resistant coating which is more durable and effective under a broader range of conditions, particularly at elevated temperatures and in acidic and saline environments.

SUMMARY OF THE INVENTION

The present invention fulfills the above described needs by providing a multilayer coating for an article or substrate and a method of protecting article substrates. The coating and coated article comprise a coating system which comprises a first distinct layer of a first composition over a metal substrate and a second distinct layer of a second composition over the first distinct layer, wherein the composition of the second distinct layer is different than the composition of the first distinct layer. The coating system may comprise additional layers.

A corresponding method of protecting a substrate or article is also disclosed. The method comprises the steps of depositing a first distinct layer of a first composition over the substrate and depositing a second distinct layer of a second composition over the first distinct layer wherein the composition of the second distinct layer is different than the composition of the first distinct layer. Preferably, the multiple layers of the coating are deposited by a combustion chemical vapor deposition process. In a first preferred embodiment, the coating comprises alternating, discrete layers of silica and chromia. In a second preferred embodiment, the coating comprises alternating, discrete layers of silica and zinc phosphate, wherein the silica layer may be a doped or undoped layer of silica. In a third preferred embodiment, the coating comprises alternating, discrete layers of silica and zinc phosphate, wherein the silica layer may be a doped or undoped layer of ceria.

Accordingly, an object of the present invention is to provide an improved corrosion-resistant coating.

Another object of this invention is to provide an improved method of protecting a corrosion susceptible substrate or article.

Still another object is to provide a coating system that is economical and easy to apply.

Other objects, features and advantages of the present invention will become apparent from the following detailed description, drawings, examples and claims.

DETAILED DESCRIPTION OF THE PREFERRED EMBODIMENTS

Metals, in particular non-noble metals, are susceptible to corrosion. Corrosion-resistant coatings have been applied to the surface of metals to protect the metal from the corrosive agent(s). The coatings must be able to withstand the corrosive agents and any environmental conditions which the coating and underlying metal are likely encounter. Two types of corrosion-resistant coatings currently used include organic coatings, such as plastic coatings and paints, and inorganic coatings. The organic coatings, while typically easy to apply, do not always provide sufficient protection in all environmental conditions. Organic coatings and coatings containing organic components degrade or melt at high temperatures and therefore are not able to withstand elevated temperatures. The multilayer coatings in accordance with the present invention do not require organic components which degrade or melt at high temperatures. Additionally, the multilayer coatings in accordance with the present invention do not require the use of any intermediate compounds such as binders, etc. to add additional weight and cost or limit the use of the coatings at high temperatures. The multilayer coatings in accordance with the invention are better able to withstand elevated temperatures and liquid corrosive environments than conventional coatings.

Although, inorganic coatings are better able to withstand elevated temperatures they are more difficult to apply than organic coatings. Additionally, inorganic coatings, such as aluminum oxide, silicon dioxide, chromium oxide, etc., typically have low coefficients of thermal expansion relative to the metals, steel, aluminum, copper, brass, etc., upon which they are coated to protect. When the metal substrates and the overlying inorganic coatings are subject to large temperature changes, the metal substrate expands to a greater degree than the overlying inorganic coating. The coefficient of expansion mismatch causes the brittle inorganic coatings to crack and break away from the surfaces of the metal substrate, a phenomenon referred to as spalling. Thus, the metal substrate is no longer protected by the inorganic coating and may become exposed to the corrosive agents.

The present invention teaches an improved coating system that is better able to withstand elevated temperatures and with improved corrosion resistance. The improved performance of the coatings is obtained by using thin layers which are better able to withstand the large temperature changes and by using multiple layers which provide improved corrosion resistance. Such coating systems are useful for protecting most metal substrates, including aluminum, iron, copper, nickel, and titanium alloys. Also, composites containing metals can be protected or a metal substrate of any material with a metal coating thereon can be similarly protected. As used herein the term "substrate" is intended to include articles. The coatings are particularly useful for articles which are used at elevated temperatures, such as turbines that are subject to large temperature changes and corrosive combustion gases but can still be beneficial for substrates which are never exposed to elevated temperatures.

The multilayer coatings can be used as a primer under additional coatings, as a finish coating or include within its structure a non-nanolaminate layer, for example a non-nanolaminate layer of a metal such as gold or nickel to provide a desirable, aesthetic finish. The optional, non-nanolaminate can vary in thickness and position and can be below, between or over the nanolaminate layers of a coating of the invention. A base adhesion treatment of the substrate such as silane treatment, cleaning, polishing, etching and other various treatments are desirable to ensure better bonding and performance of the nultilayer coating. In particular, the substrate should be cleaned of debris and oils to improve bonding.

The coating systems in accordance with the present invention comprise at least two thin, distinct layers of two differing compositions. In an alternative embodiment, the second layer comprises a composition with a coefficient of thermal expansion that is intermediate to the lower coefficient of thermal expansion of the composition of the first layer and the higher coefficient of thermal expansion of the substrate. The coating systems may include any number of additional layers, with fewer layers being more economical and easier to apply. Coating systems consisting of four, five and six distinct layers of alternating compositions of silica and chromia are demonstrated in the following examples Coating systems consisting of two and five distinct layers of alternating compositions of doped or undoped silica and zinc phosphate and systems consisting of four distinct layers of alternating compositions silica and ceria are also demonstrated in the examples.

Coating systems comprising thinner layers are preferred because thin layers reduce cost and weight and are preferred in applications in which weight and cost are critical factors such as components of automobiles and airplanes. Ideally, the layers making up the coating should be as thin as possible while still providing sufficient corrosion protection. A coating system in which each of the individual layers is less than 400 nanometers (nm) in thickness is preferred. The term "nanolaminate" as used herein is defined as a laminate or multilayer material of more than one layer wherein the thicknesses of the individual layers, not including the substrate, are measured in nanometers. The term nanolaminate is meant to include laminates of two or more layers wherein the thickness of the each individual layer not including the substrate is less than 400 nanometers.

One aspect of the present invention involves the composition of the layers. At least one of the layers should comprise a corrosion-resistant composition. Preferably, each layer is useful in corrosion resistance or passivation. The multilayer coatings of the invention, as demonstrated in the Examples below, have good adhesion to the substrate and excellent corrosion protection in salt spray tests, in salt water immersion tests and at elevated temperatures. The coatings may be composed of readily available, inexpensive materials that require no special treatment during or after their application. The multilayers may be applied to various metal substrates which are subject to corrosion, including but not limited to: aluminum, iron, titanium, tin, copper, nickel and alloys of the previously mentioned metals.

The layers of the coating should comprise at least one layer, preferably two layers, of a material whose potential for corrosion is less than that of the substrate upon which the layer(s) is to be coated on to protect. Preferred corrosion-resistant materials do not degrade at high temperatures and are able to withstand the corrosive conditions and agents which they are likely to encounter such as salt, acids, combustion gasses, humidity, oxygen, etc. Preferred corrosion-resistant materials include inorganic oxides. Preferred corrosion-resistant materials demonstrated in the Examples include silica, chromia, zinc phosphate, ceria and lithia doped silica. The term "silica" as used herein is meant to include all binary compounds of silicon and oxygen, $Si_xO_y$, of which the most preferable compound is silicon dioxide, $SiO_2$. The term "chromia" as used herein is meant to include any binary compound of chromium and oxygen, $Cr_xO_y$, of which the most prevalent is chromium(III)oxide, $Cr_2O_3$. The term "lithia" as used herein is meant to include all binary compounds of lithium and oxygen, $Li_xO_y$, particularly lithium oxide, $Li_2O_2$. The term "ceria" as used herein is meant to include all binary compounds of cerium and oxygen, $Ce_xO_y$, particularly cerium dioxide, $CeO_2$. Zinc phosphate is $Zn_3(PO_4)_2$. Other known corrosion-resistant materials, such as nitrides, carbides, carbonates, phosphides, phosphates, borides, metals and other oxides can be similarly effective in a multilayer coating, especially if nanolaminated.

The formation of multiple layers of thin coatings is beneficial for corrosion resistance. The total thickness of the combined layers of coating should be less than about 40 microns wherein each of the individual layers is less than about 10 microns thick. Total thicknesses of less than about 10 microns and individual layer thicknesses of less than about 2 microns are preferred economically. Total coating thicknesses of less than 2 microns are preferred and 1 micron are especially preferred because thermal expansion mismatch between the thin coating layers and the substrate is less detrimental since thinner coatings and layers are better able to withstand the stresses and strains generated during temperature changes. When the combined thickness of the layers of the coating system is greater than one micron, thermal expansion mismatch is a factor and should be considered.

Multilayer coatings can take advantage of the properties of different compositions of the different layers of the coating and combine them into essentially one useful coating system. Thus, the composition of a layer may be selected to alleviate a problem inherent in one of the other layers of coating. In addition, the presence of multiple layers allows an upper layer of coating to be abraded away without losing substrate protection altogether. One embodiment described herein uses the beneficial properties of both silica and chromia to provide protective coatings. This silica/chromia system also exhibits the advantage of allowing deposition without cracks forming during their development at elevated temperatures. Another embodiment described herein uses the beneficial properties of both silica and zinc phosphate to provide protective coatings, especially for brass.

Although not wishing to be bond in theory, it is believed that the present invention operates by the following theory. It is known that when materials are formed into very thin films, the materials of the thin films are observed to have different physical properties than the physical properties of the same materials in bulk. By producing a multilayer material there ire multiple layers of these specialized properties which can interact with each other and the surrounding environment differentially. Further, specialized properties can be made by combining specific, layered materials and can be optimized for specific substrates and forms of corrosion. For wet corrosion, the materials can be optimized for passivation. This can be accomplished by forming an inert and/or absorbing effect surface, in regard to the active species within the wet environment, to make less susceptible or passivate the corrosive mechanism, such as active ion species. Since the films are so thin the materials should be passivating and not be regarded as cathodic protection, i.e. sacrificial. Another important consideration is that the materials of the specific layer can be deposited as dense inherent coatings at substrate temperatures which will not cause substrate deterioration. A preferred method of depositing the layers of the coating without causing substrate deterioration is a combustion chemical vapor deposition method. Multiple layers also provide protection when one of the layers fails due to an excessive corrosion event or abrasion.

For elevated temperature protection the minimization of diffusion species will provide the greatest protection. Diffusion of corroding species is greatest along grain boundaries. Compound materials tend to have lower diffusivities than a single material. By nanolaminating, the grain boundaries are oriented transverse to the undesired diffusional direction and thus are not conduits for oxidation or other corrosion species. Further, the mode or mechanism of diffusion is changed as it goes from one material to the next. Thus, nanolaminates can greatly reduce the net diffusional flux of the corrosion species. Another factor to consider is the effect of corrosion or alteration species accumulating at grain boundaries. Once a high concentration of the corrosion species is present at a grain boundary or in the present case the boundary between two materials of the nanolaminate, then the diffusion of the species will be minimized by the presence of such a high concentration zone. In fact, since the total coating thickness is protective at less than 1 micron thickness, diffusion may be a factor in even wet corrosion at ambient conditions. This theory may explain why multilayer coatings work better than single layer materials and the expected cumulative effect of such single layers.

It is also desirable to have one or more of the layers within the nanolaminate to be fracture tough or malleable. The inclusion of a fracture tough or malleable layer provides additional wear and abrasion resistance to the substrate. An example of a wear resistant coating including a fracture tough or malleable layer can be provided by alternating layers of nickel and silica. The silica layers provide protection from corrosion and the nickel layers provide wear resistance and fracture toughness. A coating system comprising a nickel layer and a silica layer provide increased corrosion and wear resistance as theorized above.

By layering two materials, namely silica and chromia, the corrosion resistance of the silica can be exploited while the higher thermal expansion coefficient of the chromia layer acts as a buffer between the aluminum with its high coefficient of thermal expansion ($23 \times 10^{-6}$ $K^{-1}$) and the silica with its low coefficient of thermal expansion ($0.55 \times 10^{-6}$ $K^{-1}$). The silica is deposited to take advantage of its high corrosion resistance. Silica exhibits good corrosion resistance when present as a thick coating. However, the present inventor has discovered that multiple, thinner layers are better able to withstand more thermal expansion mismatch than would a single layer of silica of comparable thickness. Silica is a preferred base layer for initial oxidation protection and for deposition, but other protective materials can also be used.

The chromia buffering layers with their intermediate coefficient of thermal expansion separate the silica layers and help to minimize the expansion mismatch between silica coating and substrate. Further, nanolaminates having different properties than the bulk materials may act to passivate the corrosive compounds. The silica layers in the examples below are composed essentially of oxides of silicon, namely silicon dioxide, and make up a substantial proportion by weight of the multilayer coatings of the examples since the chromia layers are relatively very thin.

While silica and chromia were found to be successful with aluminum substrates, this particular nanolaminate combination was not as effective for protecting brass substrates. A literature search for materials that are used to protect brass yielded a number of potential candidates. Several materials were tested. As individual layers, both lithia doped silica and zinc phosphate were found to provide some protection. But it was not until these materials were combined as a nanolaminate that a significant increase in the amount of protection was achieved. The coatings were tested using copper-accelerated acetic acid-salt spray/fog testing (hereinafter CASS) using copper chloride. The importance of the multilayer coatings is demonstrated by the fact that if a single layer coating exceeded a few hundred nanometers in thickness the single layer coating would rapidly peel as an individual layer and lose protection for the substrate.

The individual layers of the coatings of the present invention can be deposited by any method capable of depositing thin layers onto the substrate such as sol-gel, physical vapor deposition and other chemical vapor deposition techniques. A preferred process of depositing the coating systems on substrates without detrimentally affecting the substrates is a combustion chemical vapor deposition method known as CCVD, described in U.S. Pat. No. 5,652,021 and incorporated herein in its entirety by reference. The use of the CCVD method is ideally suited to the continuous application of multilayered coatings since only the solution feed to the deposition apparatus needs to be altered to change the deposited material. Thus a multilayer coating of alternating or differing composition may be quickly and easily deposited. Additionally, the coatings can be applied by the CCVD method to large and complicated-shaped articles, such as airplane turbines, propellers, etc.

The CCVD method is a method of applying coatings to substrates using chemical vapor deposition. The CCVD method is accomplished by mixing together a reagent and a carrier solution to form a reagent mixture. The reagent mixture is ignited to create a flame or the reagent mixture is flowed through a plasma torch in which the reagent mixture is at least partially vaporized into a vapor phase. The reagent mixture involves the direct combustion of flammable liquids or vapors which contain the elements, or reagents to be deposited. The substrate to be coated is located proximate the flame's end and the vapor phase of the reagent is contacted to the substrate resulting in deposition of a coating or layer of the reagent. The deposition can be controlled so as to have a preferred orientation of the coating onto the substrate.

Flammable organic solvents containing elemental constituents of the desired coating in solution as dissolved reagents should be selected for the CCVD process. The solution is sprayed though a nozzle or vaporizer and burned. The solvent is used to convey the coating reagents and to provide the combustible material necessary to produce a flame. Alternatively, the vapor reagents can be fed into the flame and burned. Upon burning, the reagent species present in the flame chemically react and vaporize and then may be deposited onto a substrate held in the combustion gases or just beyond the flame's end to form a coating on the substrate. Longer coating times can be used to produce thicker coatings.

The CCVD process allows the use of a lower plasma temperature than conventional plasma spraying processes thus not affecting the substrate surface with elevated temperatures. Only enough heat to chemically react the reagents is necessary. The reactions occur at lower temperatures than necessary to melt the resulting materials as required with convention plasma spraying processes. Such lower temperatures allows the use of less expensive, safer, and more mobile equipment yet produce a film of equal or better quality than most coating methods. Thus, the coating of surfaces of interior parts and complex shaped parts in the field may be possible.

The coatings of the following examples, both the single layer Comparative Examples and the multilayer examples within the present invention were produced in a continuous manner using the CCVD process. In the multilayer examples, Examples 1–4, each of the layers of the multilayer coating system was deposited without interrupting the flame. This was achieved by only altering the precursor feed composition as allowed by the CCVD process. The corrosion resistances of a single layer of chromia on an aluminum substrate, of a single layer of silica on both an aluminum and a steel substrate and of silica/chromia multilayer coatings on both aluminum and steel substrates were studied and are labeled as Comparative Examples A–C respectively. The process of preparing the coatings and the results of the studies of the coatings are described in the following Examples.

The multiple layers of the coatings were deposited via the CCVD process using the following process. Initially, a clean substrate was prepared. Oils and debris should be removed from the substrate before application of a coating to allow good adhesion to the substrate and performance. The deposition conditions may need to be determined through experimentation depending on the substrate material, geometry and cooling conditions. Low deposition temperatures are often required to minimize or eliminate adversely affecting the substrate properties. However, there are instances where low deposition temperatures are not necessary and there may be instances where elevated temperatures would be desirable.

The low deposition temperatures can be obtained with short substrate dwell times or with cooling of the substrate side opposite the flame, i.e. with water or with air. The first desired precursor solution was pumped to the torch flame, and the first layer of coating material was deposited onto the substrate. After the desired deposition time and thickness the sample was moved away from the flame and the solution flow was switched from one solution to another. Once the new solution was flowing through the torch, the oxygen flow rate and current setting through the torch needle were adjusted to the appropriate values for the second solution. The change from one solution to the second solution flowing through the torch is indicated by a color change in the flame. Once the flame and flame color were stable with the second solution flow, the sample was moved back in front of the flame at the appropriate position. This procedure was repeated for the desired number of layers. Alternatively, multiple flames of for example, silica and chromia, could be used to deposit the specific desired materials and moved relative to the substrate to produce a multilayer coating in an assembly line-type fashion.

The metal organic precursor chemicals used consists of the same organic compounds incorporated in the development of the aforementioned coatings: tetraethoxysilane (hereinafter TEOS), $[Si(OC_2H_5)_4]$, and chromium(III) acetylacetonate, $[Cr(CH_3COCHCOCH_3)_3]$. These precursor chemicals were mixed into separate solutions with toluene (methyl benzene), 1-butanol (n-butyl alcohol) and propane. The TEOS and chromium(III)acetylacetonate are to date the best precursor chemicals as far as deposition and solubility in common solvents. The TEOS solution concentration was 0.037M and apart from the precursor chemical, the solution contained, by volume: 9.12% toluene, 0.87% 1-butanol and 90.01% propane. The chromium acetylacetonate solution concentration was 0.002M and apart from precursor chemical contained, by volume, 10.58% toluene, 4.38% 1-butanol and 85.04% propane. These concentrations were found to be good but are not absolute for deposition. The concentrations can be altered to a certain extent to affect the deposition rates. However, the relative amounts of equivalent solvents are recommended to ensure solution stability. These solutions were prepared to be soluble in each other by using the same solvents since they come into contact when the solution flow is switched from one material to the other during processing. If the solutions are not soluble, precipitation of the chemical constituents or other unfavorable reactions could occur when they contact each other. Compatibility of silica and chromia deposition solutions is not needed if separate flames are used.

The environmental concerns associated with the CCVD process used in producing a nanolaminate are addressed by the combustion process. Oxygen-rich flames are used for complete combustion of the precursor and for reduced $NO_x$ production. Finer atomization improves vaporization and thus film quality. Extremely fine atomization was obtained by using the near supercritical atomization as described in U.S. patent application Ser. No. 08/691,853, filed Aug. 2, 1997, entitled "Chemical Vapor Deposition and Powder Formation Using Thermal Spray with Near Supercritical and Supercritical Fluid Solutions" which is incorporated by reference herein in its entirety. Volatile organic compounds are combusted to water and carbon dioxide, which may be safely exhausted through a laboratory fume hood. The tetraethoxysilane and chromium acetylacetonate and any other precursors form the associated oxides of the coating, water and carbon dioxide in the flame. The silicates not deposited are essentially the same material as that which is a component in common dust. Thus, the preferred method is environmentally safe, producing no hazardous byproducts and can be used outdoors or in a vented area.

The improved corrosion resistances of the coatings of the present invention are not limited to corrosion resistance in salt-containing environments, although test results indicate that the coatings of the present invention have excellent corrosion resistance in salt-containing environments. The multilayer coatings of the present invention have also been proven effective at elevated temperatures and are expected to be effective in any other conditions and environments to which silica, chromia or other coating layers in accordance with the present invention exhibit resistance. The silica/chromia multilayer coatings of Examples 1–3 in accordance with the present invention have been shown to provide corrosion protection to a temperature sensitive alloy at a temperature of 550° C. in air. The multilayer coatings in accordance with the present invention provide the corrosion resistance and any beneficial substrate oxidation will be incidental.

The present invention provides a coating system that can be deposited in a continuous manner for the corrosion protection of metals, particularly against corrosion in aqueous environments and at elevated temperatures. The effectiveness of the coating system of the present has been demonstrated by salt water spray testing, salt water/acetic acid immersion testing and CASS testing and by elevated temperature furnace testing. Alternatively, the coating system of the present invention can be applied to articles, surfaces or substrates in order to provide other beneficial surface properties, such as surface appearance luster, wear resistance, hydrophobicity, etc.

Using the CCVD process, nanolaminate layers can be deposited which offer corrosion protection to a variety of substrates used in a wide range of applications. An additional attribute of the nanolaminate is that by varying the deposited thickness of the coating or the combination of elements or compounds used in the multi-layering, the appearance of the final product can be controlled. Thus, such processing could provide corrosion-resistant surfaces that have cosmetic or aesthetic finishes. The deposition thickness can be controlled to result in coating with a preferred thin film interference color, or the thickness can be varied over the substrate surface to produce an array of the thin film interference colors. Layers of metal, e.g. gold, silver and platinum, can also be included in the multi-layering scheme to provide a desired metallic luster to the final corrosion-resistant multi-layered coating.

COMPARATIVE EXAMPLE A

Single layer coatings consisting essentially of silica were deposited by the CCVD process onto aluminum plates and were tested to determine the ability of an individual silica coating to protect an underlying substrate in aqueous corrosive conditions. The silica coatings were observed to have fairly good corrosion resistance in 5 weight percent NaCl aqueous solutions. However, due to the low coefficient of thermal expansion of silica coatings relative to the higher coefficient of thermal expansion of the aluminum substrates to which the silica coatings were adhered, the silica coatings were subject to crack formation during their development as a coating and would presumably be subject to such crack formation during use at elevated temperatures. These cracks will allow potentially corrosive agents to contact the underlying aluminum substrates and lead to corrosion of the aluminum substrate. Since temperatures of about 100° C. and higher are necessary in the deposition process, thermal expansion mismatch between the coating and substrate is a viable concern. Only thin silica coatings can resist the cracking resulting from the thermal expansion mismatch. However, such small thicknesses of a single material are not as desirable for corrosion resistance.

COMPARATIVE EXAMPLE B

Single layer coatings consisting essentially of chromia were deposited by the CCVD process onto aluminum plates by a similar process to the aluminum plates of Comparative Example A. The chromia-coated aluminum plates were tested to determine the ability of an individual chromia coating to protect an underlying substrate in aqueous corrosive conditions. The chromia-coated aluminum plates were tested in a 5 weight % NaCl solution for only up to three days. The specimens' visual appearance were observed to have changed in color. This indicated that corrosion of the chromia-coated aluminum specimens had occurred.

COMPARATIVE EXAMPLE C

Additionally, single layer coatings consisting essentially of silica were deposited by a CCVD process onto iron/cobalt alloy plates using a similar process and were tested for corrosion resistance at elevated temperatures in an oxidizing environment. Iron/cobalt alloy plates are very susceptible to oxide formation at elevated temperatures. These specimens were tested at elevated temperatures of at least 400° C. The silica only coatings were not successful in preventing oxidation of the underlying iron/cobalt substrates.

Since the results of the testing of the single oxide layers were unsatisfactory, alternating layers of silica and chromia were proposed. The following Examples showed very good corrosion resistance in aqueous corrosive environments, at least 30 days in an aqueous 5% NaCl solution at a pH of 3. The multilayer coatings in accordance with the invention showed superior corrosion protection compared to single layers. In fact, a more acidic test solution was used to test the multilayer coatings compared to the solution used to test the above single layer coatings. Additionally, the multilayer coatings in accordance with the invention showed superior corrosion protection at elevated temperatures. The temperature susceptible iron/cobalt alloy was adequately protected during exposure to air at 550° C. for 12 hours when coated with a silica/chromia multilayer whereas the silica only coating was not able to provide protection at 400° C. The details of the coatings are provided below.

EXAMPLE 1

Multilayer coatings of silica and chromia were deposited onto aluminum using the CCVD process. During the deposition, the solution flow rate, oxygen flow rate and cooling air flow rate were kept constant. The flow rate for the solution was 3.0 ml/min. and for the oxygen 3000 ml/min. at 65 psi. The cooling air was at ambient temperature and the flow rate was 9800 ml/min. at 80 psi. The cooling air flow rate was directed at the back of the substrate with a copper tube whose end was positioned one inch from the back of the substrate. Two deposition parameters were changed with each changeover in solution. These included the flame temperature at the substrate surface as measured with a type K thermocouple positioned in line with the flame close to the specimen surface (700° C. for the silicon solution and 650° C. for the chromium solution) and the current passing through the torch needle as controlled with a variac (about 3.0 amps for the silicon solution and 2.5 amps for the chromium solution). The flame from the silicon solution was blue while the flame from the chromium solution was pink.

The solution flowing to the torch was changed five times for a total of three layers of silica (layers 1, 3 and 5) and two layers of chromia (layers 2 and 4). Additionally, four and six layer samples were produced. The four layer samples comprised a substrate and sequential layers of silica, chromia, silica and chromia. The six layer samples comprised a substrate and sequential layers of silica, chromia, silica, chromia, silica and chromia. The size of the rectangular aluminum plate substrate, 3 cm×5 cm, required that flame move along a pattern to coat all of the substrate evenly. Thus, the sample was moved in a manner so that the flame followed the perimeter of the specimen. This produced uniform coatings as observed by the thin film interference colors. Eight laps were performed for each of the two solutions for each of the separate layers. The two different solutions were applied at different speeds. The silica solution was deposited in just over 14 minutes for the eight laps while the chromia solution was deposited in just over 13 minutes for the eight laps. During the deposition, the thin film interference colors eventually were no longer distinguishable as the layers were deposited. The thicknesses of the individual silica layers varied form about 0.3 microns to about 0.5 microns and the thickness of the individual chromia layers was less than 0.05 microns. The total thicknesses of the four layer samples varied from about 0.6 microns to about 1 micron and the five and six layer samples from about 1 to about 1.5 microns. The final color of the specimens with the five film layers was gold/yellow.

The samples were initially tested for corrosion resistance in an aqueous solution of 5% NaCl with a pH of approximately 3, attained with an appropriate addition of acetic acid. The samples were tested by immersion in the solution such that the liquid reached half way up the sample's long dimension. Only one of the twelve tested samples in accordance with this Example was observed to have any noticeable corrosion.

Energy dispersive x-ray (hereinafter EDX) analysis revealed that the coating was high in silicon, possibly indicating that the three layers that are visible in the micrograph are all silica and that the chromia layers are either too thin to be observed, dissolved or just not visible in this picture or at this magnification. The chromia layers were intentionally deposited as very thin coatings compared to the silica layers, so their appearance in the SEM as separate layers would not be expected. The chromium solution concentration was almost one third of that used to form the individual chromium oxide coatings described in the Comparative Examples above. EDX analysis did indicate the presence of chromium, so the material was deposited. Numerous aluminum substrates with the same multilayer coating were also tested by Behr Automotive of Stuttgart, Germany, also using a salt water/acetic acid immersion test. After 30 days of immersion testing, the coatings were observed to have only a few microscopic pores. These microscopic pores are considered within acceptable limits.

EXAMPLE 2

The same silica/chromia multilayer coating described above that was deposited onto aluminum plate was also deposited onto 4 inch by 6 inch, aluminum-coated carbon steel plates. The aluminum-coated surface onto which the deposition occurred had more surface roughness than the aluminum plates of Example 1. These specimens were tested by an independent testing laboratory, Battelle of Columbus, Ohio, in a salt spray chamber. These multilayer coated, aluminum-coated plates withstood 1344 hours of testing without any noticeable signs of corrosion, thus, surpassing Military C-83488 Specifications (672 hours minimum). This substrate with the multilayer was also tested in the 3 pH salt immersion test and lasted over two weeks without any visual evidence of corrosion. Conversely, a bare substrate without coating was observed to have visual signs of corrosion in one day.

EXAMPLE 3

A similar silica/chromia multilayer coating as described above was deposited onto an iron/cobalt alloy in order to determine elevated temperature corrosion resistance. The composition of the layers was identical as above Examples 1 and 2 but only three layers were used, silica/chromia/silica. Coated and uncoated specimens were tested in a tube furnace at a minimum of 400° C. for 12 hours in the air. The coated specimens were protected from corrosion at 550° C. with some change in interference colors and no or little evidence of substrate oxide formulation in localized areas, even when the upper layer experienced peeling and spallation due to too great a thickness. Uncoated substrates showed extensive corrosion as exhibited by oxide formation and discoloration.

EXAMPLE 4

Brass is a metal susceptible to corrosion in salt water solutions by the leaching of zinc from the alloy, i.e. dezincification. The silica/chromia multilayer described in Example 1 was deposited onto brass specimens measuring approximately 1.5 inch by 2 inch and 0.1 inch thick. The silica/chromia multilayer-coated samples were tested in an accelerated salt test solution as described in the standard test ASTM B368-85, not in a fog but by immersion. This solution consisted of 5 parts by weight sodium chloride, 95 parts by weight distilled water, 0.25 g reagent grade copper chloride per liter of salt solution and acetic acid added to reach a solution pH of 3.1 to 3.3. The silica/chromia multilayer-coated samples corroded in the corrosion solution. Therefore, a new coating was developed to deposit onto brass for corrosion protection in the described solution.

Single and multilayered coatings of lithia doped silicon oxide (1 atomic % Li) and undoped silicon oxide and zinc phosphate ($ZnPO_4$) were deposited onto brass specimens as described above. The silicon precursor was tetraethoxysilane in toluene (1.5 weight % Si), the lithium precursor was Li t-butoxide in methanol (0.6 weight % Li), the zinc phosphate precursors were zinc 2-ethylhexanoate in toluene and mineral spirits (1 weight % Zn) and triethylphosphate in toluene (1.7 weight % P), respectively. The Li-doped silica solution had a final solution weight percent of 0.0007 silicon and 0.000002 lithium, with 11.2 added weight percent of toluene and 83.8 added weight percent of instrument grade propane. The zinc phosphate solution had a final solution weight percent of 0.0002 zinc and 0.0002 phosphorous, with 3.3 added weight percent of toluene and 92.8 added weight percent of instrument grade propane.

During the deposition, the solution flow rate and oxygen flow rate were kept constant. The flow rate for the solution was 3.0 ml/min and for the oxygen about 4.0 L/min at 80 psi. The cooling air was at ambient temperature and the flow rate was varied between 2.5 and 12.8 L/min at 90 psi. For the five layered samples, the flow rate was 12.8 L/min during the first layer (Li-doped silica) and either 7.5 or 2.5 L/min for the four subsequent layers. The current passing through the needle was about 2.5 Amp for silica, about 2.9 Amp for Li-doped silica and about 2.7 Amp for the zinc phosphate. The gas temperature at the surface of the sample for all deposition materials was 700° C.

The number of layers deposited was one, two and five. The silica (doped or undoped) was deposited as a single layer, as a base layer with another layer applied on top and, when doped, as layer(s) 1, 3 and 5 of a multilayered coating. The zinc phosphate was deposited as a single layer, as a second layer with a silica base layer and as layers 2 and 4 in a multilayered coating. The thickness of each distinct layer was less than about 100 nanometers The sample size dictated that the sample move during the deposition. The program moved in the same pattern and at the same rate for each material; only the time (or number of motion program laps) of the deposition varied, thus, resulting in different thicknesses of deposited material. In general, the zinc phosphate deposition time per layer was approximately three times that of the silica deposition time.

All the samples were tested in the ASTM B 368-85 solution except for one sample which consisted only of zinc phosphate on an aluminum plate. This sample was tested in a solution as above but without the copper chloride. Only minor corrosion was observed after 17 days. All samples (aluminum and brass) were immersed in the test solution. Only one side of each sample was coated and the uncoated side of each sample was completely covered with tape to prevent contact with the test solution.

Brass samples coated with just Li-doped silica showed better corrosion resistance in the corrosion solution than when coated with undoped silica. Brass samples coated with just zinc phosphate and a silica base layer also showed good corrosion resistance. However, when these two coatings were combined into multilayers on a brass sample, the corrosion resistance improved. One sample coated with an undoped silica base layer and a top layer of zinc phosphate was immersed in the corrosion solution and showed no signs of corrosion after two months; the edges exhibited corrosion but they were not purposefully coated. Ten samples coated with Li-doped silica as layers 1, 3 and 5 and with zinc phosphate as layers 2 and 4 were immersed in the above corrosion solution for two weeks and showed no signs of corrosion except at the uncoated edges of some of the samples.

EXAMPLE 5

Multilayer coatings of silica and ceria were deposited onto AISI 1010 steel substrates using a CCVD process. During the deposition of the layers of the coating, the solution flow rate and oxygen flow rate were kept constant. The flow rate for the solution was 3.0 ml/min. and the flow rate for the oxygen was 4000 ml/min. at 80 psi. The cooling air was at ambient temperature. The flow rate for the silica was varied from 18.9 to 21.9 liters/min. and the flow rate for the ceria was varied from 12.8 to 18.9 liters/min. The cooling air flow rate was directed at the back of the substrate with a cooper tube whose end was positioned approximately one and a half inches from the back of the substrate. The flame temperature at the substrate surface was 700° C. for the silica and 750° C. for the ceria. The current passing through the needle was 2.5 amps for silica and 2.6 amps for ceria.

The silica solution had the same concentration as that mentioned previously for the TEOS precursor solution but did not contain 1-butanol. The ceria solution was composed of Ce-2-ethylhexanoate in toluene, comprising approximately 1.8 weight percent cerium with additional toluene and propane. The overall ceria solution concentration was 0.001M.

The solution flowing to the torch was changed four times for a total of two layers of silica (layers 1 and 3), each silica layer about 70 nm thick, and two layers of ceria (layers 2 and 4), each ceria layer about 60 nm thick. Five samples were coated onto 1.5 inch by 1.5 inch steel plates. Each sample was moved in a manner so that the flame followed its perimeter. The coating time for silica was approximately 5 minutes per layer and for the ceria was approximately 20 minutes per layer for four of the samples. The fifth sample had a ceria coating time of 10 minutes per layer. The total coating thickness was less than 1 $\mu$m in all cases.

The samples were tested in a salt spray chamber with a 5% NaCl salt solution with a pH of approximately 6.5 as measured with 0.3 interval indicator paper. The salt spray chamber temperature was 95 to 96° F. All the samples survived at least 170 hours in the salt fog without any substrate rust on the coated area (except for one small, pin-hole sized, isolated spot on one sample). The film interference colors were still apparent with only some film color change.

The above Detailed Description of the Preferred Embodiments and Examples are presented for illustrative purposes only and are not intended to limit the spirit and scope of the present invention, and its equivalents, as defined in the appended claims. It is to be understood that the foregoing relates to particular embodiments of this invention and that numerous changes may be made without departing from the scope and spirit of the invention.

What is claimed is:

1. A multilayer inorganic coating on a metal substrate comprising:

a first distinct layer of a first inorganic composition disposed over the substrate, wherein the first distinct layer has a thickness that is not greater than about 10 microns, and a second distinct layer of a second inorganic composition disposed over the first distinct layer, wherein the second distinct layer has a thickness that is not greater than about 10 microns and either the first distinct layer or the second distinct layer is corrosion-resistant, and wherein the second distinct layer comprises zinc phosphate, an oxide of chromium or an oxide of cerium.

2. The coating of claim 1, wherein the first layer comprises silicon dioxide and the second layer comprises chromium(III)oxide.

3. The coating of claim 1, wherein the first layer comprises silicon dioxide and the second layer comprises zinc phosphate.

4. The coating of claim 1, wherein the first layer comprises lithia doped silicon dioxide and the second layer comprises zinc phosphate.

5. The coating of claim 1, wherein the first layer comprises silicon dioxide and the second layer comprises ceria.

6. The coating of claim 1, wherein the first distinct layer has a thickness of not greater than about 200 nanometers and the second distinct layer has a thickness of not greater than about 200 nanometers.

7. A multilayer inorganic coating on a metal substrate comprising:
- a first distinct layer of a first inorganic composition disposed over the substrate, wherein the first distinct layer has a thickness that is not greater than about 10 microns;
- a second distinct layer of a second inorganic composition over the first distinct layer, wherein the second distinct layer has a thickness that is not greater than about 10 microns and either the first distinct layer or the second distinct layer is corrosion-resistant;
- a third distinct layer of a composition different from the composition of the second distinct layer disposed over the second distinct layer, wherein the thickness of the third distinct layer is not greater than about 10 microns;
- a fourth distinct layer of a composition different form the composition of the third distinct layer disposed over the third distinct layer, wherein the fourth distinct layer has a thickness not greater than 10 microns; and
- a fifth distinct layer of a composition different from the composition of the fourth distinct layer disposed over the fourth distinct layer, wherein the fifth distinct layer has a thickness not greater than 10 microns, and wherein the first distinct layer, the third distinct layer and the fifth distinct layer comprise an oxide of silicon.

8. The coating of claim 7, wherein the second distinct layer and the fourth distinct layer comprises zinc phosphate, an oxide of chromium or an oxide of cerium.

9. The coating of claim 1 wherein the first layer comprises silicon dioxide.

10. The coating of claim 1 wherein said first layer comprises lithia doped silicon dioxide.

11. The coating of claim 1 wherein the thickness of said first layer is not greater than about 0.5 microns.

12. The coating of claim 11 wherein the thickness of said second layer is not greater than about 0.5 microns.

13. The coating of claim 1 wherein the thickness of said second layer is not greater than about 0.5 microns.

14. The coating of claim 1 wherein the thickness of said first layer is not greater than about 200 nanometers.

15. The coating of claim 1 wherein the thickness of said second layer is not greater than about 200 nanometers.

16. The coating of claim 1 wherein said first distinct layer is deposited over said substrate by combustion chemical vapor deposition and said second distinct layer is deposited over said first distinct layer by combustion chemical vapor deposition.

17. The coating of claim 1 further comprising a third distinct layer of a composition different from the composition of said second distinct layer disposed over said second distinct layer, wherein said third distinct layer has a thickness not greater than about 10 microns.

18. The coating of claim 17 further comprising a fourth distinct layer of composition different from the composition of said third distinct layer disposed over said third distinct layer, wherein said fourth distinct layer has a thickness not greater than about 10 microns.

19. The coating of claim 18 further comprising a fifth distinct layer of composition different from the composition of said fourth distinct layer disposed over said fourth distinct layer, wherein said fifth distinct layer has a thickness not greater than about 10 microns.

20. The coating of claim 19 wherein said first distinct layer, said third distinct layer, and said fifth distinct layer each comprise silicon dioxide.

21. The coating of claim 20 wherein said second distinct layer and said fourth distinct layer each comprise a material selected from the group consisting of zinc phosphate, chromium oxide, and cerium oxide.

22. The coating of claim 21 wherein each of said first, second, third, fourth, and fifth distinct layers has a thickness less than about 400 nanometers.

23. The coating of claim 1 wherein the material of said first distinct layer has a coefficient of thermal expansion that is lower than the coefficient of thermal expansion of said substrate, and the material of said second distinct layer has a coefficient of thermal expansion that is higher than the coefficient of thermal expansion of the material of said first distinct layer.

* * * * *

UNITED STATES PATENT AND TRADEMARK OFFICE
CERTIFICATE OF CORRECTION

PATENT NO. : 6,214,473 B1
DATED : April 10, 2001
INVENTOR(S) : Hunt et al.

It is certified that error appears in the above-identified patent and that said Letters Patent is hereby corrected as shown below:

Column 1,
Line 3, the following paragraph should be inserted:
-- This invention was made with Government support under contract N00014-96-C-0179 and N00014-97-C-0265 awarded by the office of Naval Research. The Government has certain rights in the invention. --

Signed and Sealed this

Eighteenth Day of January, 2005

JON W. DUDAS
*Director of the United States Patent and Trademark Office*